United States Patent [19]

Essig et al.

[11] Patent Number: 4,646,257

[45] Date of Patent: Feb. 24, 1987

[54] DIGITAL MULTIPLICATION CIRCUIT FOR USE IN A MICROPROCESSOR

[75] Inventors: Daniel L. Essig; Luat Q. Pham; Joe F. Sexton, all of Houston, Tex.; Graham S. Tubbs, Tempe, Ariz.

[73] Assignee: Texas Instruments Incorporated, Dallas, Tex.

[21] Appl. No.: 538,634

[22] Filed: Oct. 3, 1983

[51] Int. Cl.[4] .............................................. G06F 7/52
[52] U.S. Cl. .................................................... 364/760
[58] Field of Search ....................................... 364/760

[56] References Cited

U.S. PATENT DOCUMENTS

| | | | |
|---|---|---|---|
| 3,566,153 | 2/1971 | Spencer, Jr. | 307/205 |
| 3,866,186 | 2/1975 | Suzuki | 340/173 |
| 4,031,379 | 6/1977 | Schwartz | 364/786 |
| 4,041,292 | 8/1977 | Kindell | 364/760 |
| 4,153,938 | 5/1979 | Ghest et al. | 364/760 |
| 4,238,833 | 12/1980 | Ghest et al. | 364/760 |
| 4,291,247 | 9/1981 | Cooper, Jr. et al. | 307/481 |
| 4,484,301 | 11/1984 | Borgerding | 364/760 |
| 4,496,965 | 1/1985 | Orcutt et al. | 357/70 |
| 4,501,977 | 2/1985 | Koike | 307/469 |
| 4,545,028 | 10/1985 | Ware | 364/760 |
| 4,546,446 | 10/1985 | Machida | 364/759 |

Primary Examiner—David H. Malzahn
Attorney, Agent, or Firm—Richard K. Robinson; Leo N. Heiting; Melvin Sharp

[57] ABSTRACT

A digital multiplication circuit for a microprocessor utilizes a modified Booth algorithm for implementing the digital multiplication of two numbers and includes a Booth recoder for recoding the multiplier into a selected number, n, of Booth operation sets where n is a positive integer that equals one-half the number of bits in the multiplier. Each operation set is applied to a second plurality of n partial products selectors which are connected in cascade arrangement according to multiplicand sets and wherein each partial product selector multiplicand set implements one of the recoded Booth operation sets. The outputs of the partial product selectors are summed by a summation means and a domino circuit means provides an evaluation pulse for each member of the partial product selector at the completion of the Booth operation set that is connected to the partial product selector.

14 Claims, 17 Drawing Figures

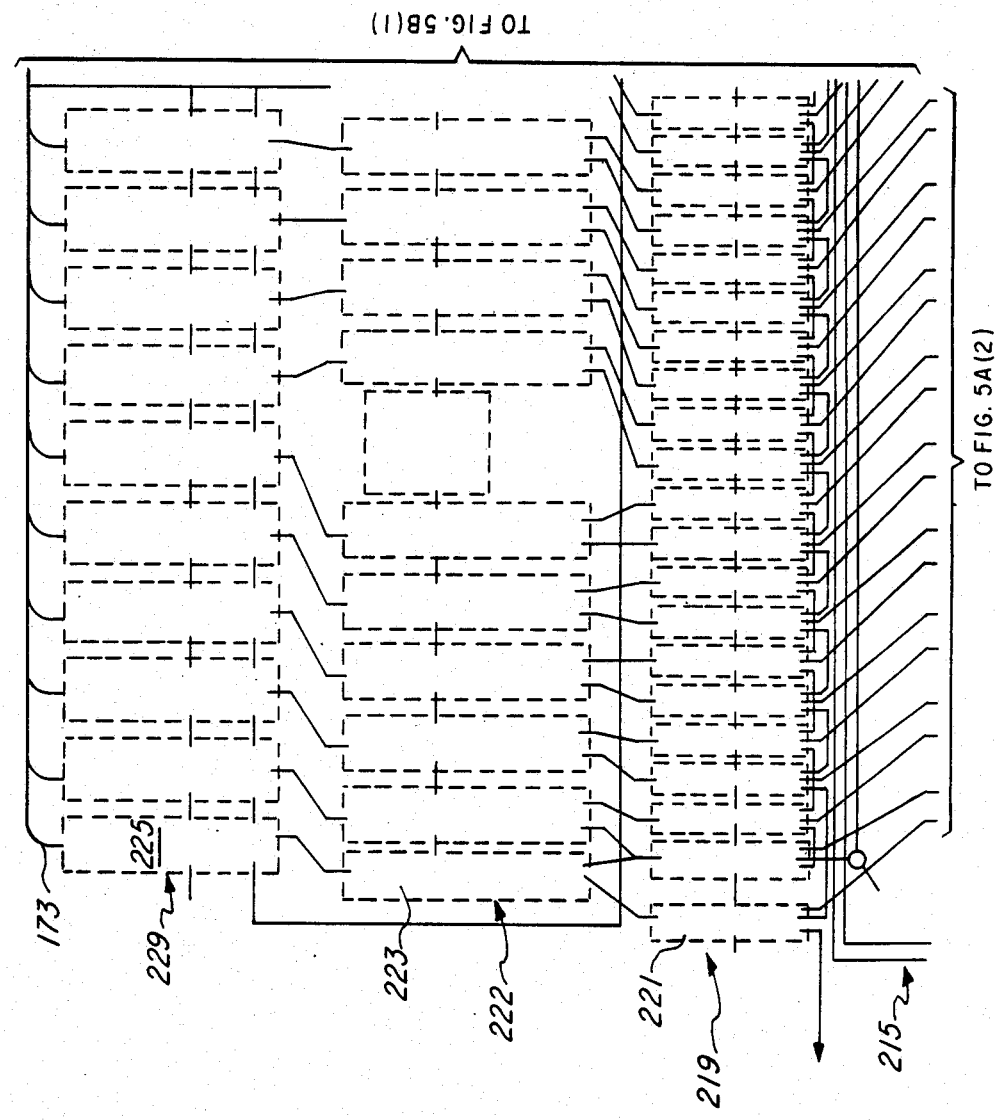

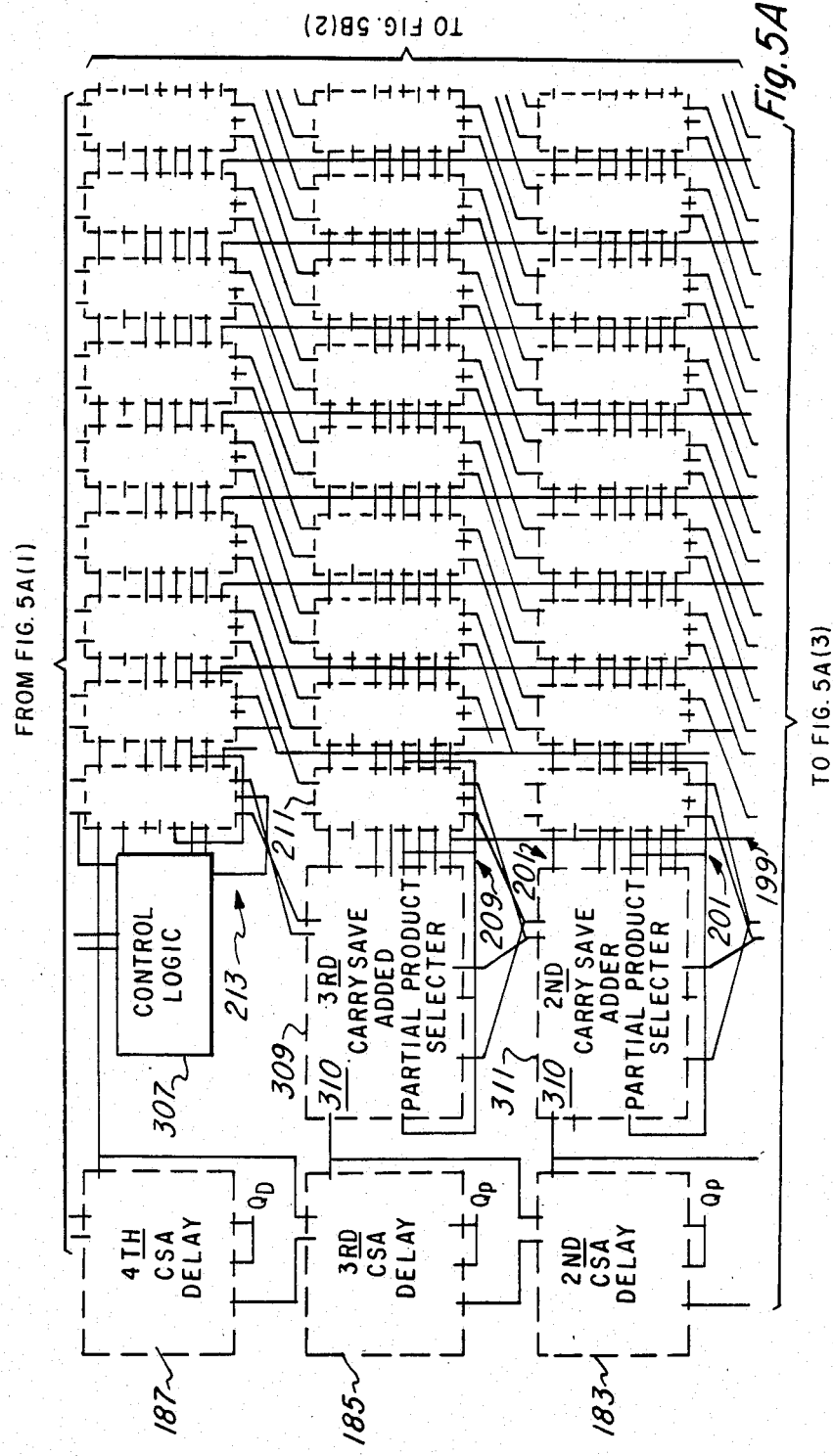

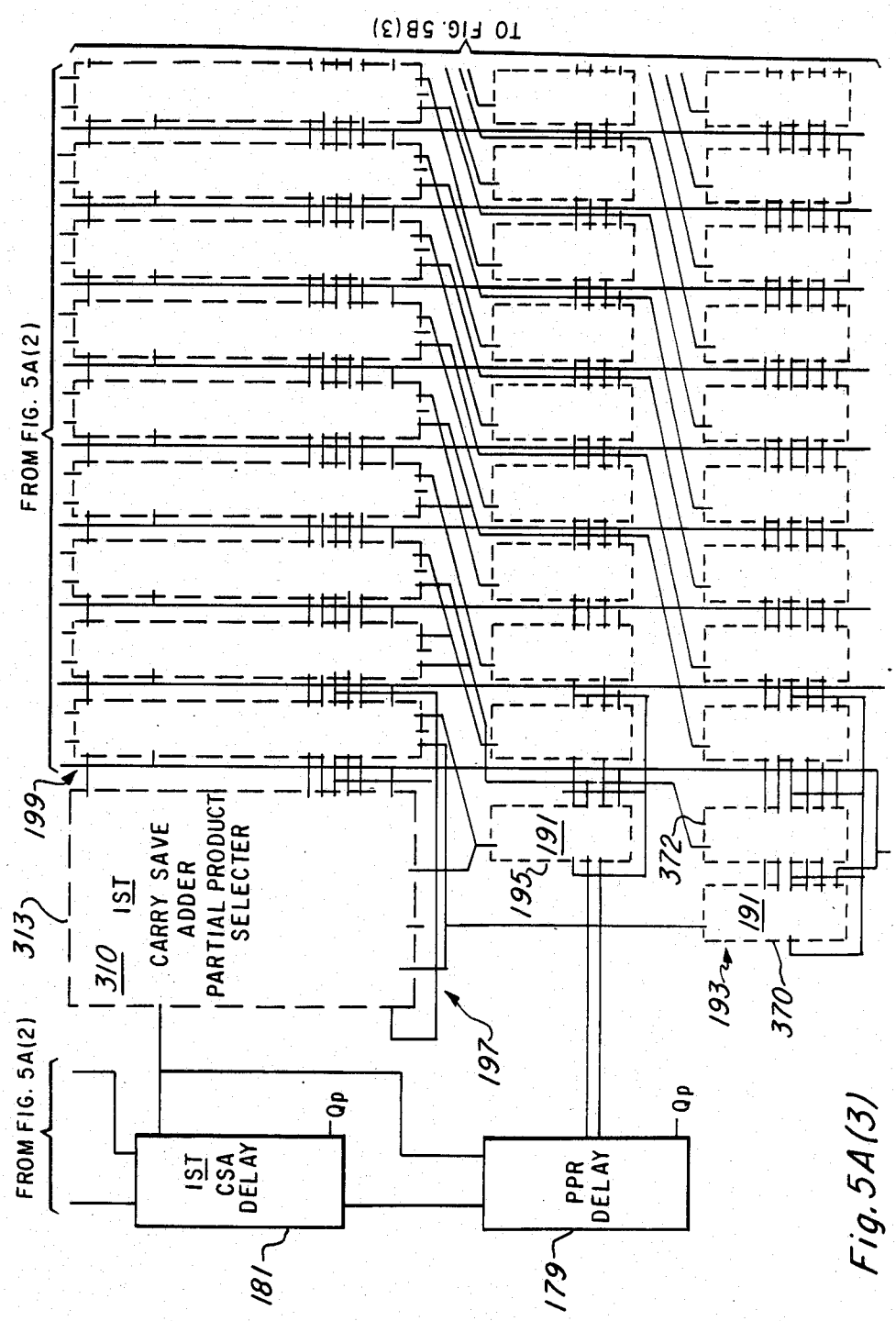
Fig. 5A(3)

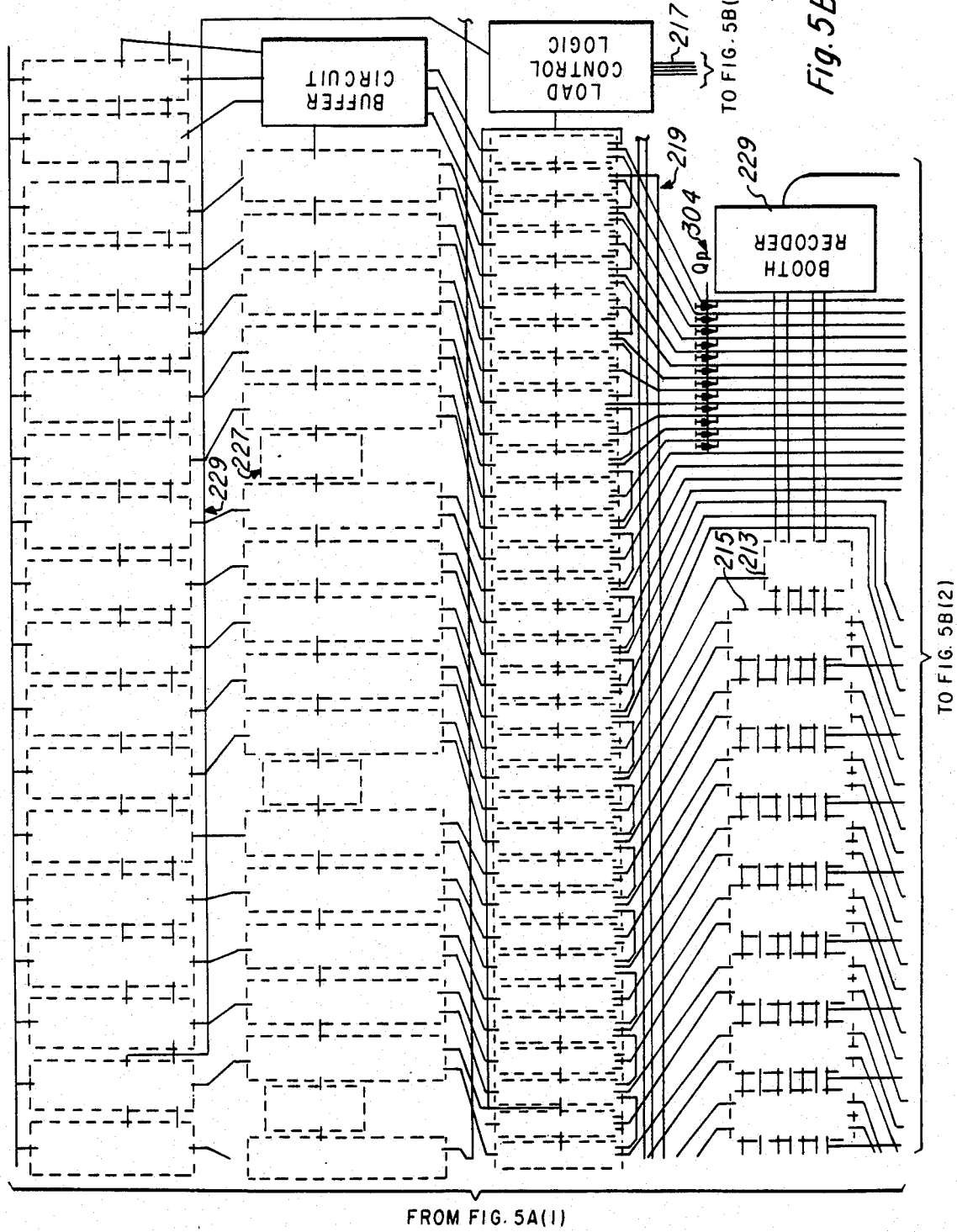

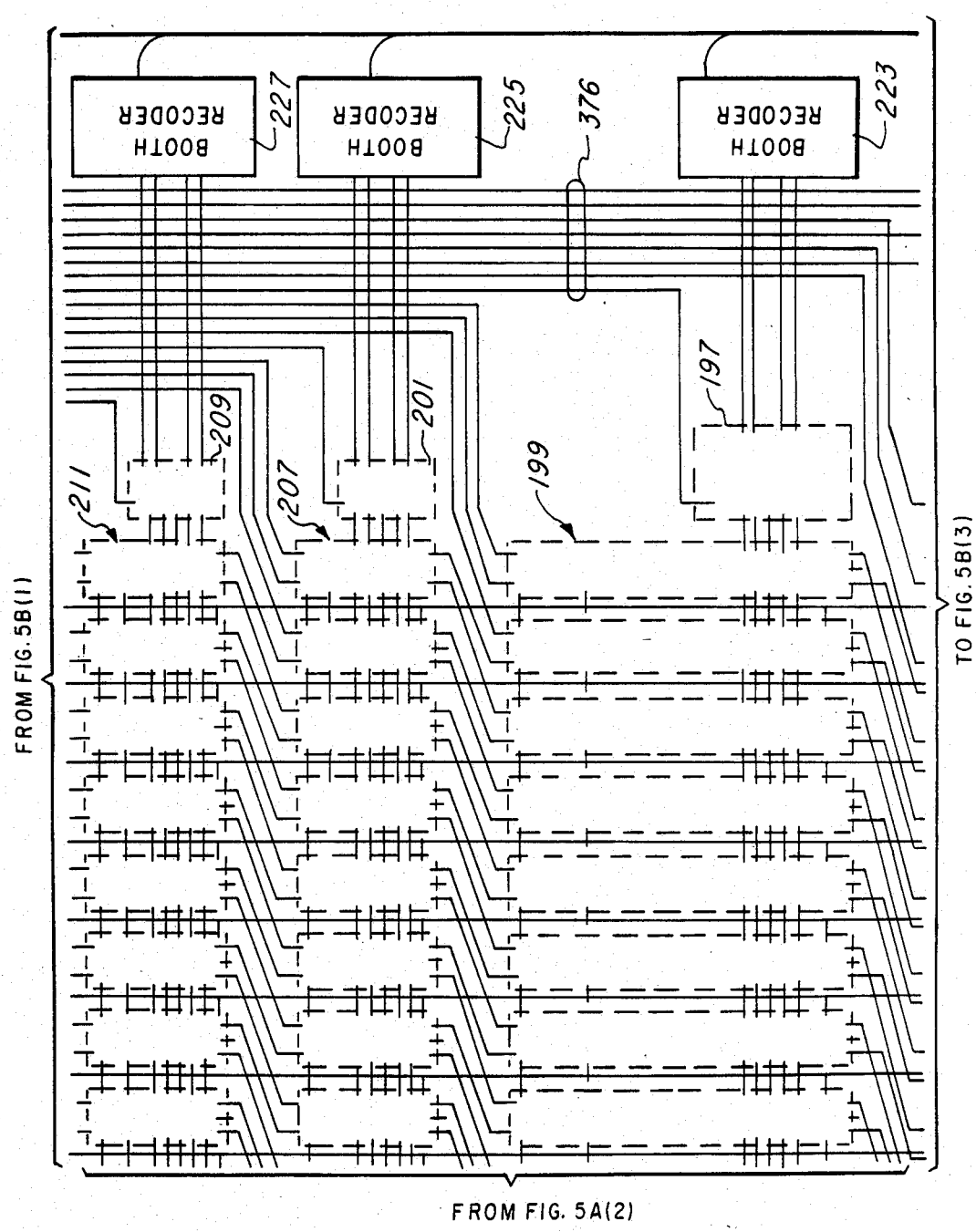
Fig. 5B(2)

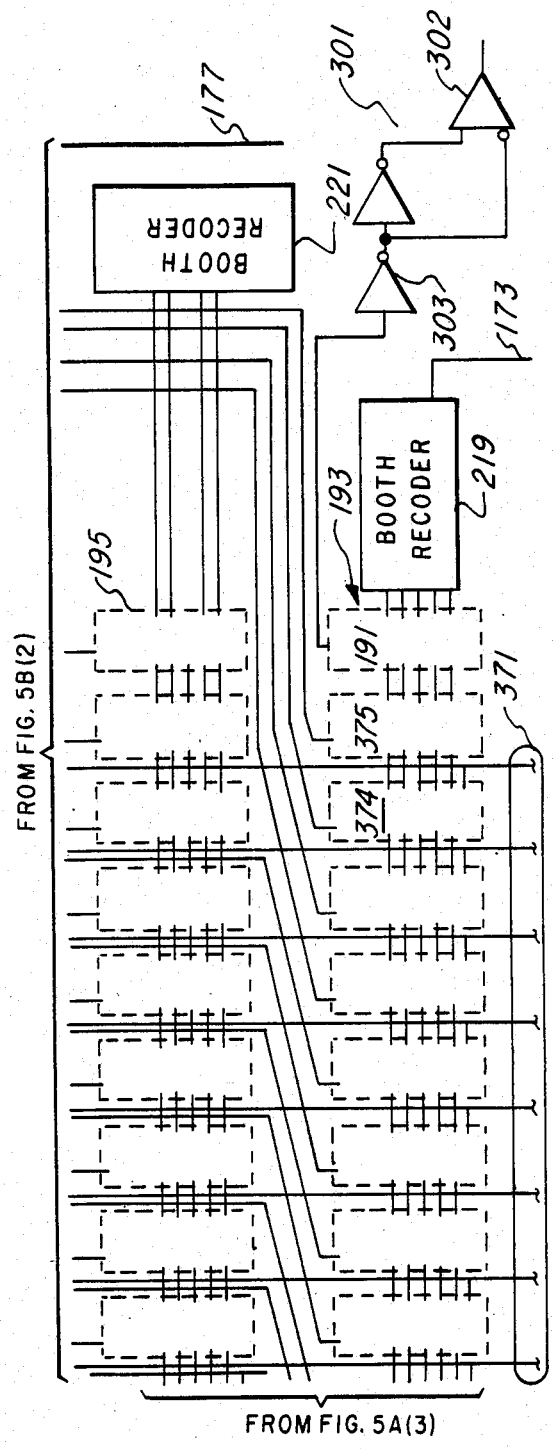
Fig.5B(3)

DIGITAL MULTIPLICATION CIRCUIT FOR USE IN A MICROPROCESSOR

BACKGROUND OF THE INVENTION

This invention relates to digital multiplication circuits, and more particular to digital multiplication circuits for use with a microprocessor in which the digital multiplication circuit is controlled by a domino control circuit.

A major limitation in the use of field effect transistor circuits and in particular, of large scale integration circuits, is the restriction associated with extending dynamic logic circuits, such as those found in a multiplier, to high-speed applications due to the necessity of multiple clocks that are required for the implementation of logic circuits with field effect transistors. Traditionally, there have been multiple clock phases required for the implementation of field effect transistor logic circuits. A precharge phase is necessary to precharge all of the data lines that interconnect the transistors used to configure the logic circuits and a second clock phase is required to evaluate the results of the implementation of the logic functions. In the cases where the logic circuits are connected together and each stage is dependent on the results of a preceding logic stage, there is a requirement for multi-phase clock functions. A first clock phase precharges all of the data lines for all of the logic circuits; a second clock phase evaluates the first logic level after which the results are applied to a second logic level which is evaluated by a third clock phase and so on through the total number of logic levels. Thus, for an N logic level function to be implemented by field effect transistor circuits, there is a requirement for N+1 clock phases, a phase to precharge all of the data lines, and a phase for each logic level to be evaluated by. The time slot ordering of the logic levels thus results in many of the logic circuits idily waiting for their turn to be evaluated with the overall consequence being that these circuits are exceptionally slow. This has traditionally not been a problem in the cases where the field effect transistor logic circuits are used for a hand-held calculator or other such applications. However, as more complicated requirements for the circuits develop, the need for speed in implementing complex logic functions becomes critical. The luxury of having circuits waiting for the appropriate time slots to be evaluated is not possible in applications that require high speed, nanosecond range, operation.

In copending application, Ser. No. 520,880, filed on Aug. 5, 1983, entitled "A Multi-Level Logic System" and assigned to Assignee of the present invention, there was disclosed the use of a multi-level logic system that incorporates a dummy load clock evaluation circuit for each stage.

The minimization of time in a microprocessor system that is required to implement multiplication functions may be reduced from many processing cycles of the microprocessor to a relative few number of microprocessor cycles through the implementation of a hardware multiplier that implements the modified Booth algorithm of digital multiplication. However, even this reduction in time is not sufficient to provide a field effect transistor type microprocessor with the speed necessary for modern technical applications.

SUMMARY OF THE INVENTION

A digital multiplication circuit for a microprocessor utilizes a modified Booth algorithm for implementing the digital multiplication of two numbers and includes a Booth recoder for recoding the multiplier into a selected number, n, of Booth operation sets where n is a positive integer that equals one-half the number of bits in the multiplier. Each operation set is applied to a second plurality of n partial products selectors which are connected in cascade arrangement according to multiplication set and wherein each partial product selector multiplication set implements one of the recoded Booth operation sets. The output of the partial product selectors are summed by a summation means and a domino circuit means provides an evaluation pulse for each member of the partial product selector at the completion of the Booth operation set that is connected to the partial product selector.

In multi-level logic circuits such as a multiplier, performance is enhanced in the speed of operation by detecting when each level of the multi-level logic circuit is ready for evaluation through the use of a domino control circuit.

The domino control circuit implements a worst case time delay for the propagation of a single clock pulse and its compliment to generate an evaluation pulse exactly when a corresponding stage of the Booth multiplier is in a position to be evaluated.

A summation means includes a plurality of summation circuits that are connected between selected members of the plurality of partial product selectors. To ensure the earliest possible evaluation of data within the summation set, the domino circuit also includes a summation circuit which represents the worst possible case as far as time delays go for the summation circuit to perform its logical operation and have data ready to be evaluated. At the expiration of that time, the domino control circuit provides an evaluation enable pulse to the next level of logic within the multiplier.

These embodiments, as well as advantages and objective of the invention, may be obtained from reading of the specifications with the figures.

BRIEF DESCRIPTION OF THE DRAWINGS

FIGS. 5A and 5B are simplified schematic diagrams of the multiplier of FIG. 3;

DETAILED DESCRIPTION OF THE PREFERRED EMBODIMENT

Figure 1:
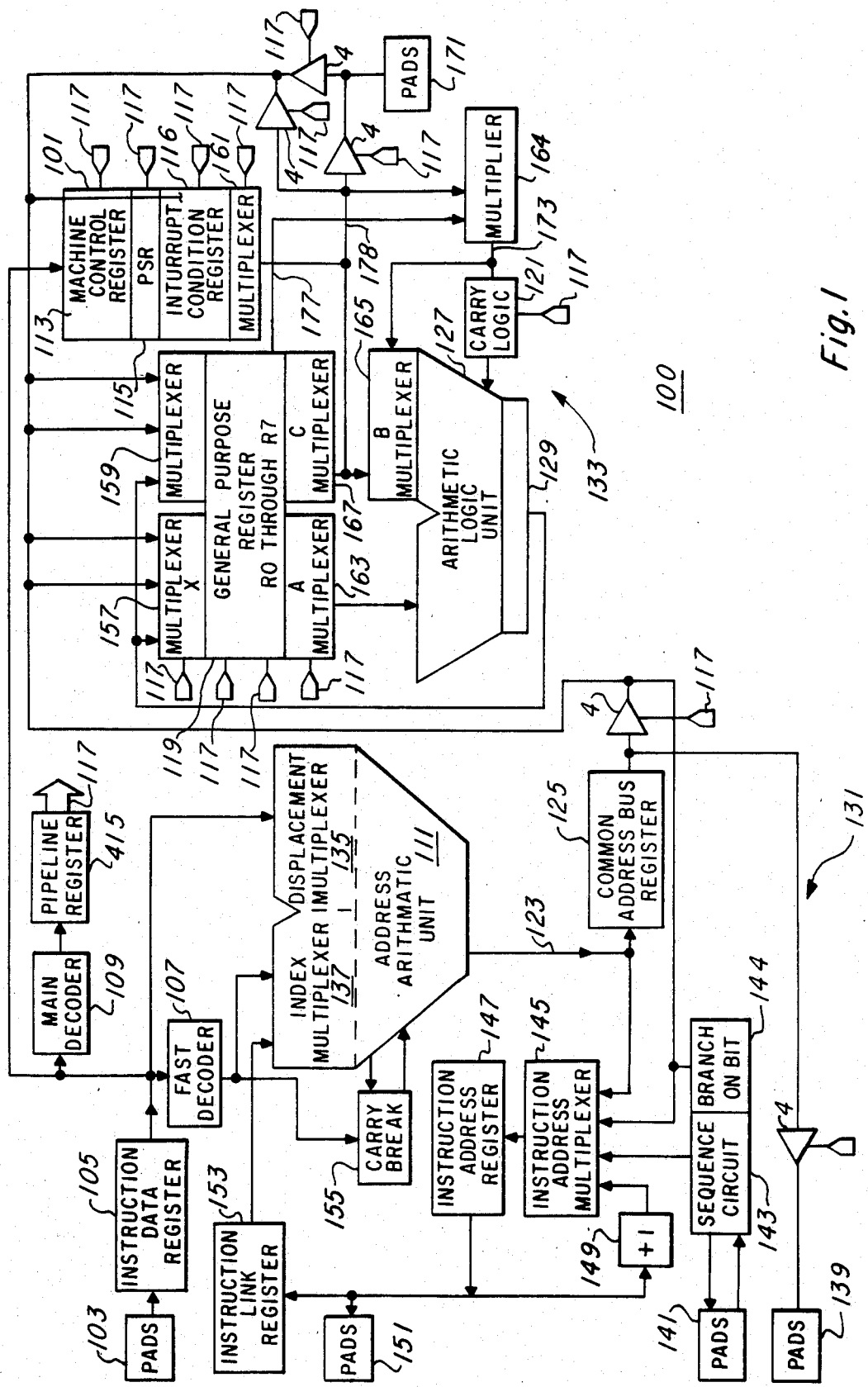
FIG. 1 is a block diagram of a microprocessor incorporating a multiplier according to the invention.

In FIG. 1, there is illustrated a microprocessor which incorporates a multiplier 161 according to the invention. Instructions from an I/O terminal (not shown) are provided via the pads 103 to an instruction data register 105 and are then applied to a fast decoder 107, a main decoder 109, and an address arithmetic unit 111. The main decoder 109 decodes the instructions into control signals which are used throughout the microprocessor. These control signals are stored in the control pipeline register 115 which conveys the decoded signals via data bundle 117 to the appropriate circuitry including the multiplier 161.

The microprocessor 100 has essentially two portions, an instruction portion represented in the area of 131 and a data portion represented in the area of 133. The address arithmetic unit 111 receives data from the instruction data register 105 via a displacement multiplexer 135 as well as data from the instruction link register 153 via the index multiplexer 137, based on the results provided by the fast decoder 107.

After the appropriate arithmetic operation is performed as directed by the carry break logic 155, the output of the address arithmetic unit 123 is latched in the common address bus register 125. The output of this register may subsequently be applied to the I/O of the integrated circuit via pads 139 to address either the data memory or input/output address space or to an internal bus for use as a constant. The output of the address arithmetic unit is also applied to the instruction address multiplexer 145. The output of this multiplexer is latched in the instruction address register 147. Another input to the multiplexer, an incremented version of the instruction address register, is provided by 149. The control of the multiplexer 145 is provided by the sequencing circuit 143. The sequencing circuit 143 controls branches and interrupts which may be received via the pads 141. The output of the instruction address register 147 is applied to the I/O via pads 151 for addressing an instruction in memory. The instruction address register 147 is also latched in the instruction link register 153 after a one-cycle delay.

The arithmetic logic unit 127 receives data from a general purpose register 119 via the A multiplexer 163 and data from the general purpose register 119, via the C multiplexer or machinec control register 113, program status register, interrupt condition register or the multiplier 161 via the B multiplexer. The carry into the arithmetic logic unit is from the carry logic 121 under the control of the main decoder. The output of the arithmetic logic unit may be adjusted in the case of an overflow—by the saturation logic 129. The output is then fed back to the general purpose registers 119 via the X and Y multiplexers 157 and 159.

When an instruction calling for a multiplication is decoded by the main decoder 107, the data in the general purpose register 119 and the output of the C multiplexer are multiplied by the multiplier 161 and the results latched in registers internal to that block.

Figure 2:
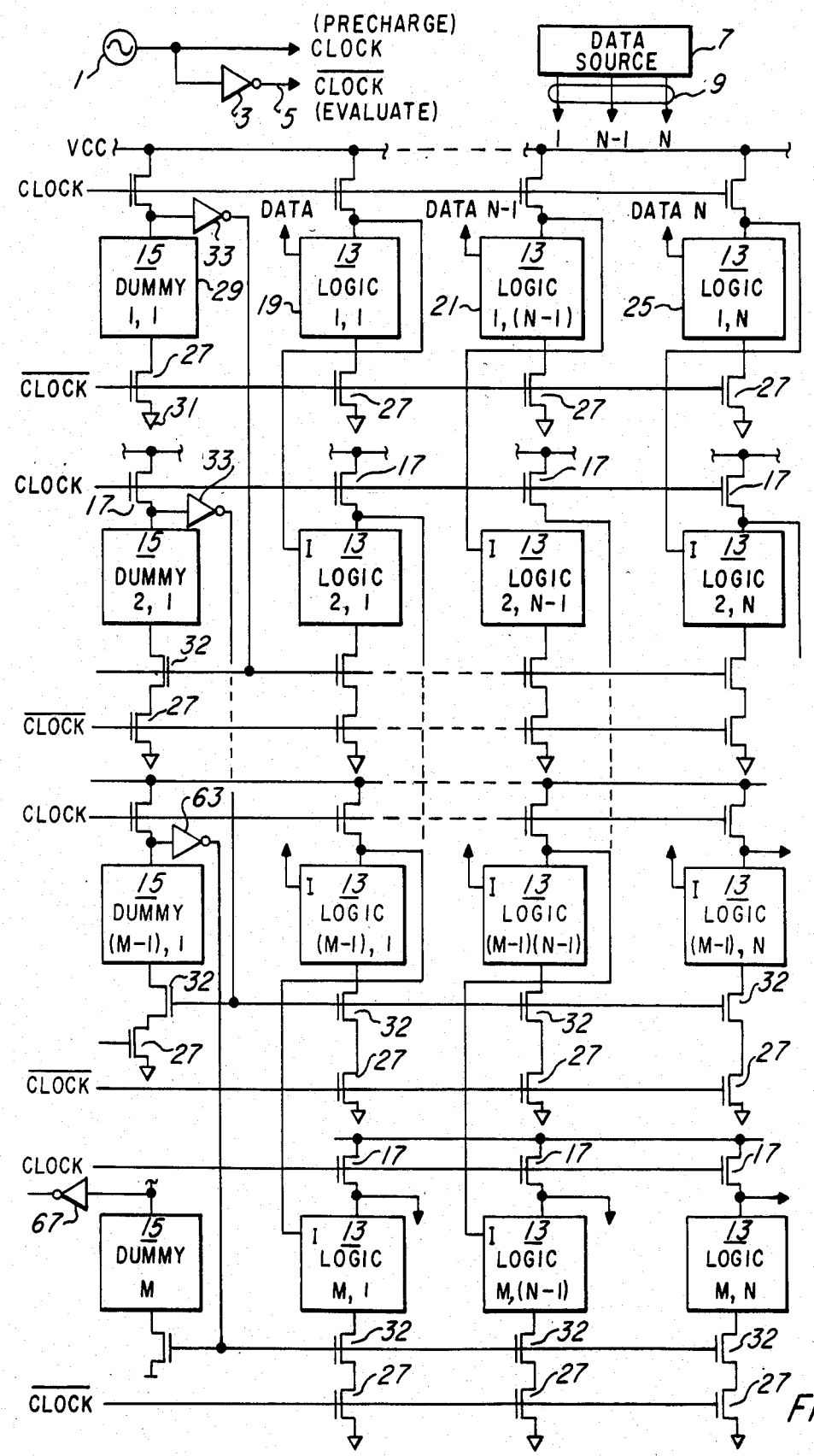
FIG. 2 is a block diagram of a domino control logic circuit.

FIG. 2, to which reference should now be made, provides the basic theory of the operation of the multiplier 161 through the use of a domino control logic circuit that is incorporated therein. There is shown a block diagram of a domino control multi-level logic as well as an inverter 3, where an inverted clock signal clock is applied to the domino circuit multi-level logic system 10. A clock source 1 provides a clock signal to the dummy load control multi-level logic system via conductor 5. A data source 7 provides parallel data signals, DATA 1 through DATA N, via data bus 9 to the domino control multi-level logic system 10. The domino control multi-level logic system includes a M times N logic elements 13. The logic elements are divided into words having a width of N logic elements that are connected together in cascade arrangement by data words to form a N by M matrix, which corresponds to a multi-level logic system of M level, having a width of N bits. Additionally, there are M domino circuits 15 that are also connected in cascade arrangement. Each logic element 13 and each domino circuitry 15 is precharged by the clock signal activating the gate of transistors 17, causing VCC, a voltage provided from a source not shown, to be applied to the corresponding logic element 13 and domino circuits 15. A 1, 1 logic element 19, 1, (N−1) logic element 21 and 1, N logic element 25, are evaluated by the clock signal activating transistors 27 which connect the corresponding logic elements to reference potential or Vdd as indicated by arrows 31. A 1, 1 domino circuit 29 is also evaluated by the clock signal and because the 1, 1 domino circuit 29 is connected to represent the worst case condition for any of the logic elements 13 that are connected in the first row an evaluation pulse is provided by an inverting amplifier 33 to the logic elements 13 that are located in the second row of the domino control multi-level logic system at a time to ensure proper evaluation. The logic elements in the second row, of course, are connected in cascade arrangements with the logic elements in the first row and are thus able to be evaluated as soon as an evaluation pulse is provided to the gates of the transistors 32, which are connected with transistor 27 to form an AND gate for ANDing the output of the inverter 33 with the clock signal provided from the inverter 3. It should be noted that data from the data source 9 is connected to the corresponding input terminal of the logic elements in the first row that is present and the Q terminals are connected to a corresponding logic element on the second row at the input terminals, thus, creating the cascade connection. This configuration is carried on completely through all M rows. The domino circuit 15 of each row is similarly connected in cascade arrangement, with each representing the worst possible condition as far as propogation delays of the signal there through to insure that when an evaluation pulse is provided on the output of the inverters 33 that the corresponding logic has completed all logical operation. The evaluation of the domino control multi-level logic system 10 only requires (M−1) domino circuit systems; however, if the data that is provided on the output of the logic elements 13 are members of the M row and is to be stored in a memory location, then a store pause may be provided on the final output inverter 33 of the M domino circuit 39. Thus the generation of the evaluation pulse for each row of logic elements is comparable to a line of end standing dominos falling with the fall of each domino producing the evaluation pulse. This provides an asynchronous operation for evaluating field effect transistor logic circuits.

Figure 3:
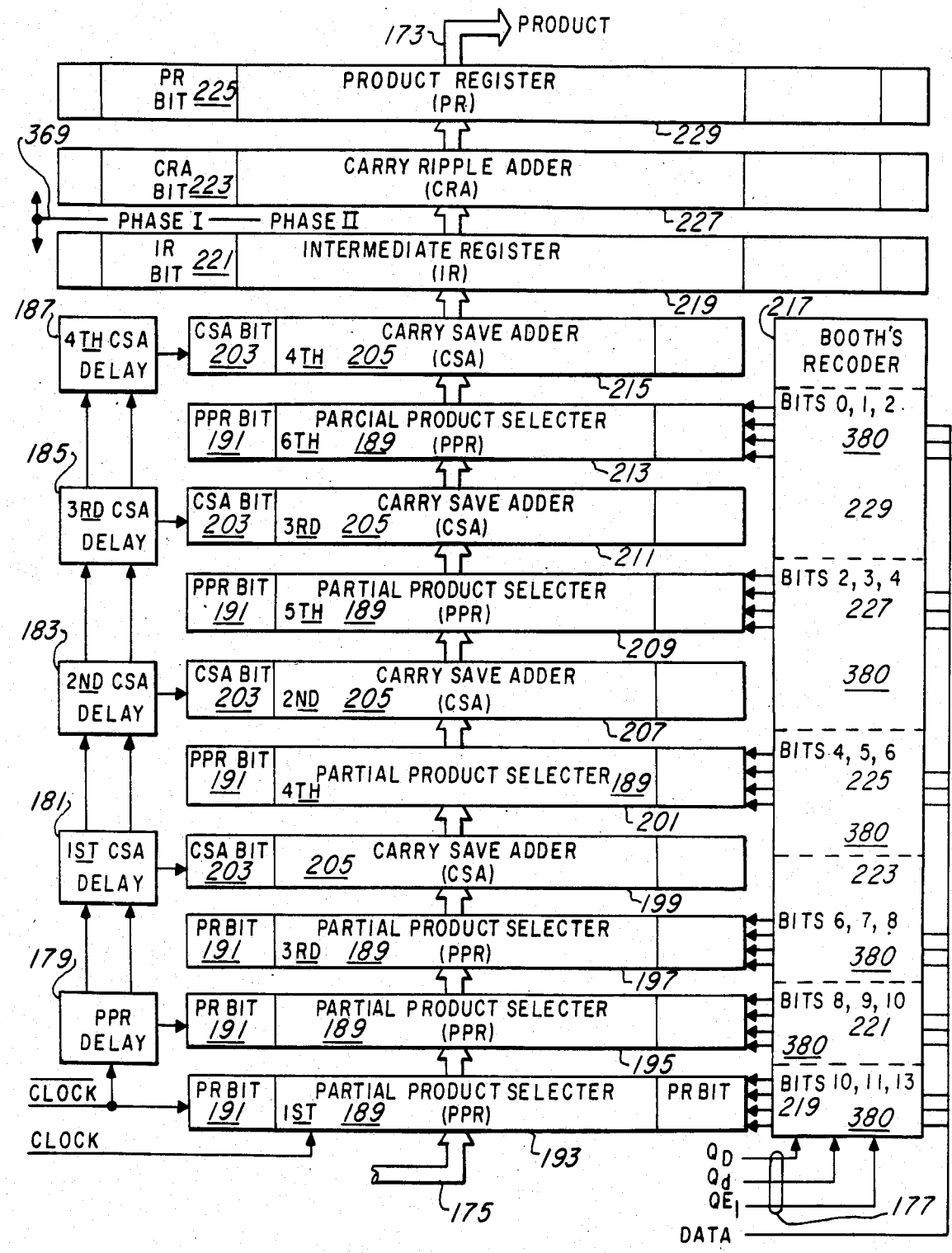
FIG. 3 is a block diagram of the multiplier of FIG. 1 according to the invention.

FIG. 3, to which reference should now be made, is a block diagram of the multiplier 161 of FIG. 1 incorporating the domino principle discussed in conjunction with FIG. 2. The multiplicand is applied to the six partial product selectors, rows 193, 195, 197, 201, 209, and 213, via data bus 175 from the C multiplexer 167 of FIG. 1. The multiplier is applied to Booth recoder 217 from general purpose register 5, 159, via conductor bundles 177. In the embodiment of FIG. 3, the multiplier is 13 bits and the multiplicand is 16 bits. However, the examples presented here are applicable to any size multiplier and any size multiplicand. All of the circuits described in FIG. 3 are precharged by a first phase, clock QP, as shown in FIG. 2 and are evaluated during selected times, as will be discussed in conjunction with FIG. 4 with an evaluation pulse. All of the partial product selectors are evaluated simultaneously by clock QE. The first partial product selector 193 is controlled by Booth recoder 219 which uses multiplier bits 10, 11, and 12. The second partial product selector 195 is controlled by a Booth recoder 221 which uses multiplier bits 8, 9, and 10. The third partial product selector 197 is controlled by a Booth recoder 223 which uses multiplier bits 6, 7 and 8. The fourth partial product selector 201 is controlled by Booth recoder 225 which uses multiplier bits 4, 5, and 6. The fifth partial product selector 209 is controlled by Booth recoder 227 which uses multiplier bits 2, 3, and 4. The sixth partial product selector is controlled by a Booth recoder 229 which uses multiplier bits 0, 1, and 2, the most significant bits. The partial products from the first three selectors, 193, 195, and 197 are summed by carry-save-adder 199. The carry-save adder is evaluated by an evaluation pulse that is provided by partial product selector delay 179. The outputs of the CSA 199 and the partial product from selector 201 are summed by CSA 207. The evaluation pulse for CSA 207 is provided by CSA delay 181. The outputs of the CSA 207 and the partial product from selector 209 are summed by CSA 211. The evaluation pulse for CSA 211 is provided by CSA delay 183. The outputs of the CSA 211 and the partial product from selector 213 are summed by CSA 215. The evaluation pulse for CSA 215 is provided by CSA delay 185. The output of CSA 215 are in intermediate register 219. This completes the activity of one clock cycle. On the subsequent clock cycle the contents of the intermediate register 119 are summed by the carry-ripple adder 227. This produces the product which is latched in the product register 229. The product register may then be applied to the arithmetic logic unit 127 via the B-multiplexer 165.

Figure 4:
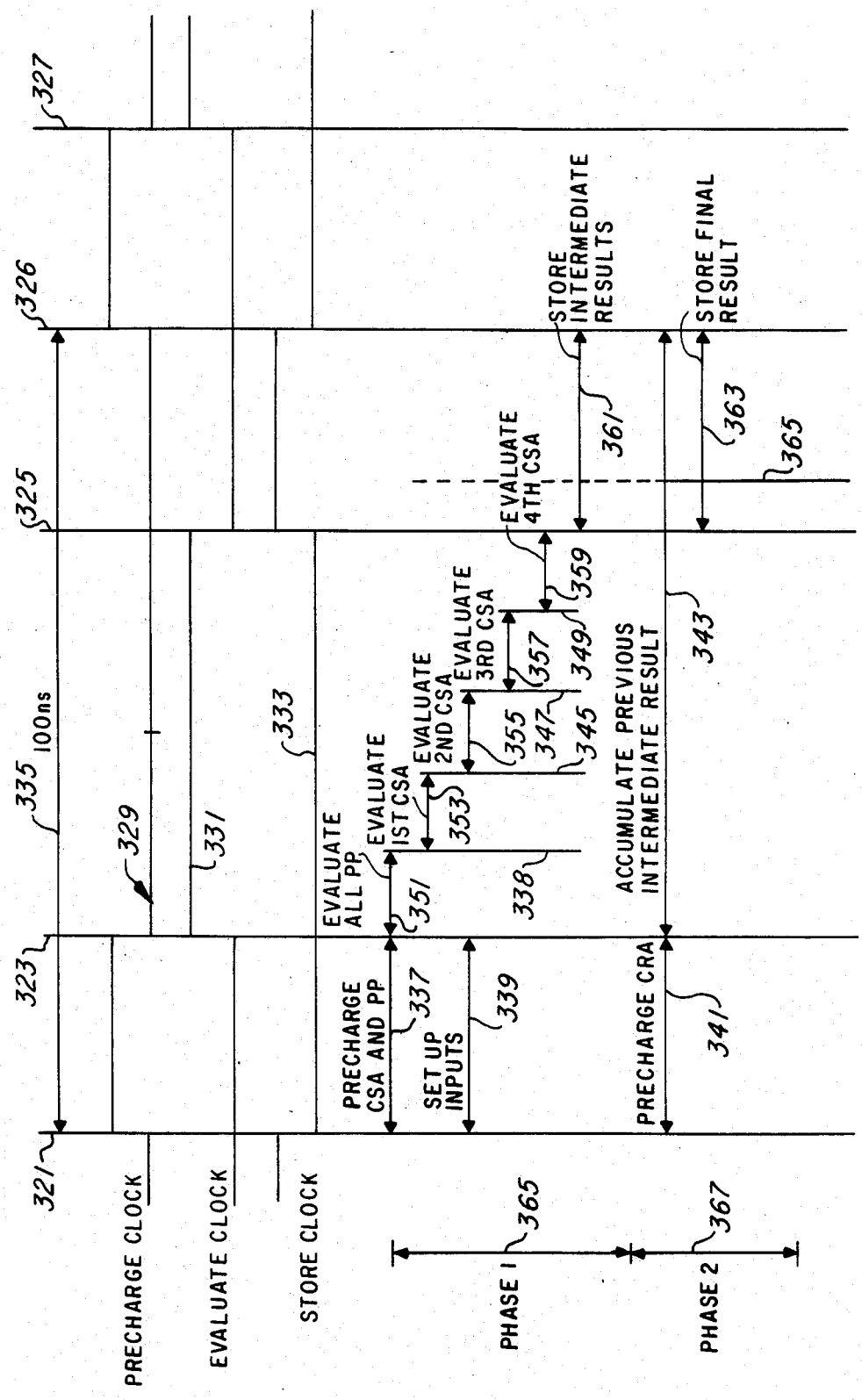
FIG. 4 is a timing diagram of the multiplier of FIG. 3.

In FIG. 4, to which reference should now be made, there is shown a timing diagram of FIG. 3, which should be used in conjunction with FIG. 4. In FIG. 3, the data enters via conductor 175 at the bottom of the page, and flows through the partial product selectors and the carry-save adders and eventually emerges from the product selector 229 at the top of FIG. 3. The separation between the intermediate register 219 and the carry-ripple adder 227 indicates the completion of a first phase 365 and the initiation of a second phase 367. This separation is indicated by line and arrow combination 369. In FIG. 4, vertical lines 321 and 326 represent the initiation of a multiply cycle in which a precharge clock will precharge the circuits within the multiplier 161 including the carry-save adders and selectors as indicated by arrow 337; provide the input data on conductor bus 175 as indicated by dimension line 339; as well as precharge the carry-ripple adder 227 as indicated by dimension line 341. At vertical line 323, the precharge clock is removed as indicated by waveform 329 and the evaluate clock is provided as indicated by waveform 331. All partial product selectors are evaluated in the period of time between vertical lines 323 and 338 as indicated by dimension line 351. The carry-save adders are sequentially evaluated with the first carry-save adder 199 being evaluated in the period of time between vertical line 338 and vertical line 345. The evaluation pulse for the carry-save adder 199 is provided by the PPS delay 179. The first CSA delay 181 provides a second evaluation pulse to the second carry-save adder 207 during the period of time between vertical line 345 and vertical line 347. The CSA evaluation pulse is indicated by dimension line 355. A third CSA evaluation pulse is provided to the third carry-save adder 211 during the period of time that is indicated by dimension line 357 which is the distance between vertical lines 347 and 349. The fourth carry-save adder 215 is evaluated by a pulse that is provided by the third CSA delay 185. This pulse occurs between the vertical lines 349 and the vertical line 365 of FIG. 4 and is represented by dimension line 359. The results of evaluation are stored in the intermediate register 219 during the period of time between vertical line 325 and the vertical line 326 thereby completing the multiplication and on the next cycle the data contained within the intermediate register 219 is summed by the carry-ripple adder 227 and applied to the product register 229 for application to the arithmetic logic unit 127 of FIG. 1. FIG. 4 illustrates that Phase I represents the operations that are performed below the line 369 of FIG. 3, and Phase II occurs after the line 369 with each phase being initiated by a clock phase, Phase I and Phase II. Therefore, the multiplier disclosed and discussed above is able to implement a complicated multiplication function and provide the information to an arithmetic logic unit at the rate of one per clock cycle.

FIGS. 5A and 5B are simplified schematic diagrams of a 16 bit by 12 bit multiplier according to the invention. The first partial product selector row 193 includes 19 cells 191 and receives the most significant bit in registers 370 and 372 with the least significant bit being applied to cell 374 in FIG. 5B. The multiple cells for the most significant bit are necessary because the most significant bit is a sign bit, and is applied to more than two separate loads. Two extra cells are required to implement the Booth operation.

The recoded Booth operand will cause the partial product selectors to perform the functions of the Booth operand. These functions are listed in Table One. In the present application of the preferred embodiment of FIG. 5 provisions are made to double the number by shifting each bit to the left. Table Two provdes the number of cells for each row and Table One provides the Truth Table for the recoding Booth algorithm.

TABLE ONE

| 3 bit number | |
|---|---|
| 000 | Add 0 to value in previous row of register |
| 001 | Add multiplicand to value in previous row of registers |
| 010 | Add multiplicand to value in previous row of registers |
| 011 | Add two times multiplicand to value in previous row |
| 100 | Subtract two times multiplicand from previous value |
| 101 | Subtract multiplicand from previous value |
| 110 | Subtract multiplicand from previous value |

TABLE ONE-continued

| 3 bit number | |
|---|---|
| 111 | Subtract 0 from previous value |

TABLE TWO

| Row, Cell and Reference Number | Number of Cells |
|---|---|
| 1 Partial product selector 193, | 19 |
| 2 Partial product selector 195, | 19 |
| 3 Partial product selector 197, | 19 |
| 4 Carry save adder 199, | 18 |
| 5 Partial product selector 201, | 19 |
| 6 Carry save adder 211, | 18 |
| 7 Partial product selector 213, | 19 |
| 8 Carry save adder 215, | 18 |
| 9 Intermediate register 219, | 54 |
| 10 Carry ripple adder 227, | 26 |
| 11 Product register 229, | 28 |

To minimize time delay, a design limitation of no more than two loads per signal source was implemented in the preferred embodiment, thus insuring that the worst case condition is a single load. This limitation is taken into consideration during the generation of the evaluation pulses. The extra cells 371 and 375 are provided and used in the implementation of the Booth alogrithm that is provided by the first Booth recoder 219. The outputs of the cells are shifted two bits to the right and applied to the second partial product selecter 195. The results of the shift are applied to the IR (Intermediate) register 219 via the conductor bundle 376 for accumulation therein. The second partial product selector's output is applied to the third partial product selectors 197, row 199 the output of which is applied to a carry-save adder. Each carry-save adder 310 used to create the rows of carry-save adders is a full adder and thus, requires 3 inputs; that is why the output of each of the first, second and third partial product selectors is applied to the first carry-save adder row 199 to provide three inputs to be summed. Thereafter, the output of each full adder 310 is applied to a following full adder 310 where its output is combined with the output of a following partial product selector and totaled with the preceding carry-save adder 310 that also includes the carry output until the total results of the multiplication function as implemented by the Booth algorithm is provided to the intermediate register 219 in accordance with the function that has been discussed in conjunction with FIGS. 3 and 4.

Figure 6:
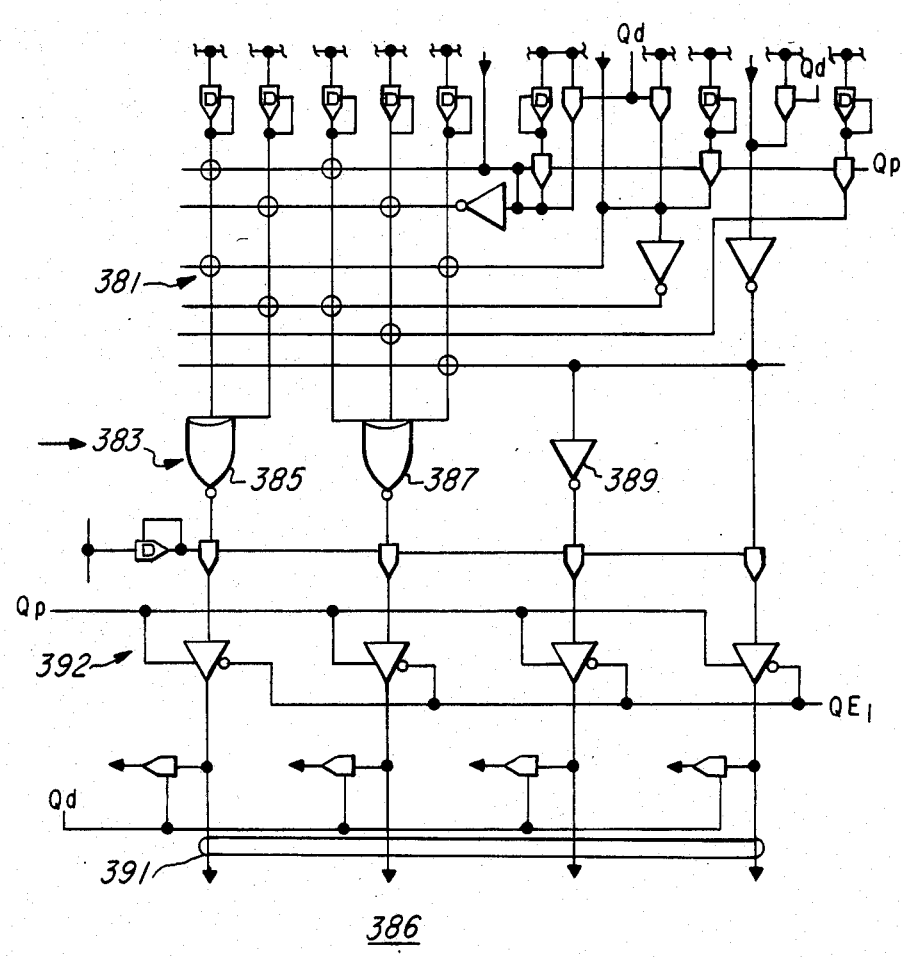
FIG. 6 is a schematic diagram of each of the Booth recoder stages of FIG. 5B.

FIG. 6 is a schematic diagram of each Booth recoder stage 380 and includes essentially a programmable logic array 381 where the Booth algorithm is recoded by the programmable logic array 381 and applied to logic devices 383 that include NOR gates 385, 387 and inverter 389. The output of the logic devices 383 is applied to the partial product selectors via the data bus 391 under the control of an evaluation pulse QE1, which is represented by dimension lines 351 of FIG. 4 and provided by the gated buffer amplifiers 392.

Figure 7:
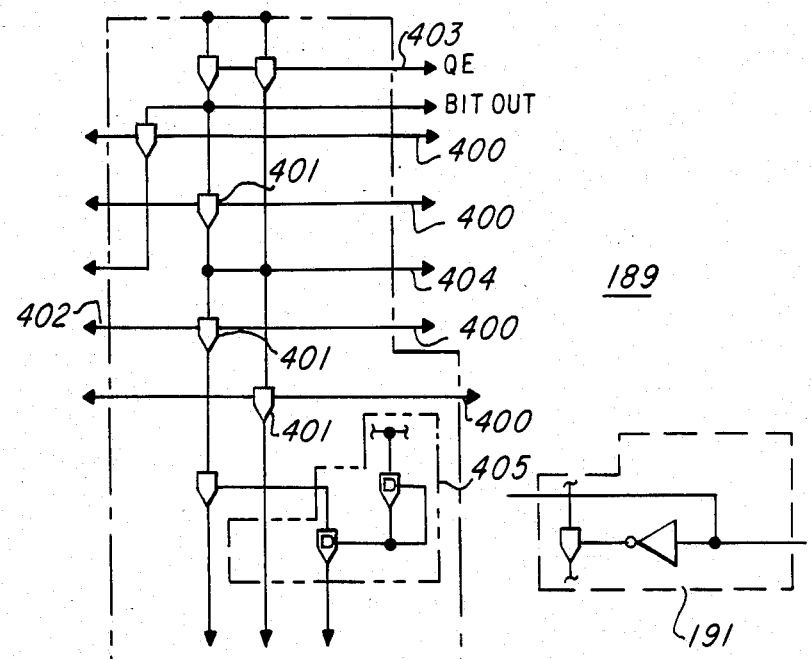
FIG. 7 is a schematic diagram of the partial product selectors 191 of FIGS. 5A and 5B.

FIG. 7 is a schematic diagram of each partial product selector 191 in which the inputs to the partial product selector are provided via data bus 400 from the Booth recoder. The output from each partial product selector is provided via data bus 403. The input to each selector cell 189 is provided via data bus 175 and inverted by 191. However, there is no input such as the least-significant bit position, then the circuit 187 has a bias provided by a circuit 405. The bias is generated by two depletion transistors being connected as illustrated in FIG. 7 to a voltage source not shown. The shift of the partial product is accomplished via paths 402 and 404.

Figure 8:
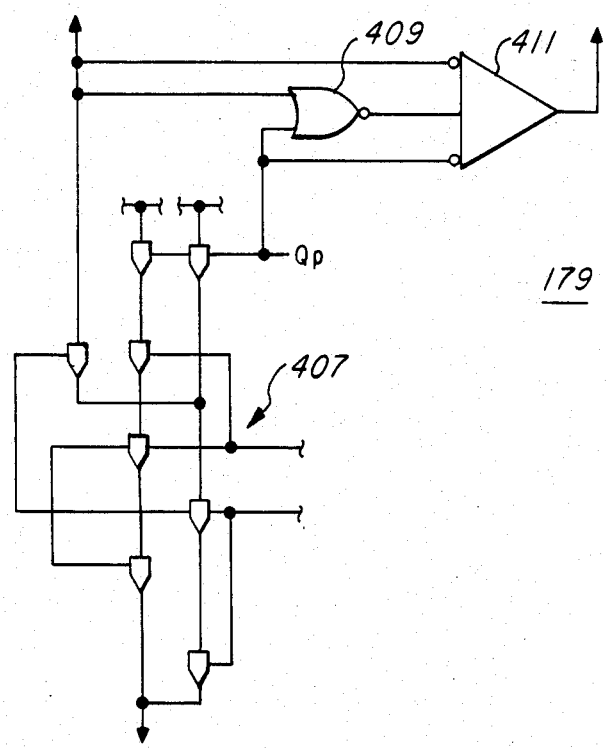
FIG. 8 is a schematic diagram of the PPR delay circuit of FIG. 5A.

The PPR delay circuit 179 is illustrated in FIG. 8 and is used to delay the evaluation pulse that is applied to the carry-save adder circuit 199 by a propogation delay that represents the worst case conditions of the partial product selectors. It includes a plurality of transistors 407 whose outputs are connected and combined by an NOR gate 409 and an amplifier 411, the results of which are applied to the first CSA delay circuit 181 and the first CSA row 199. Throughout the discussion of the figures, QE represents the evaluation pulse QP represents the precharge pulse.

Figure 9:
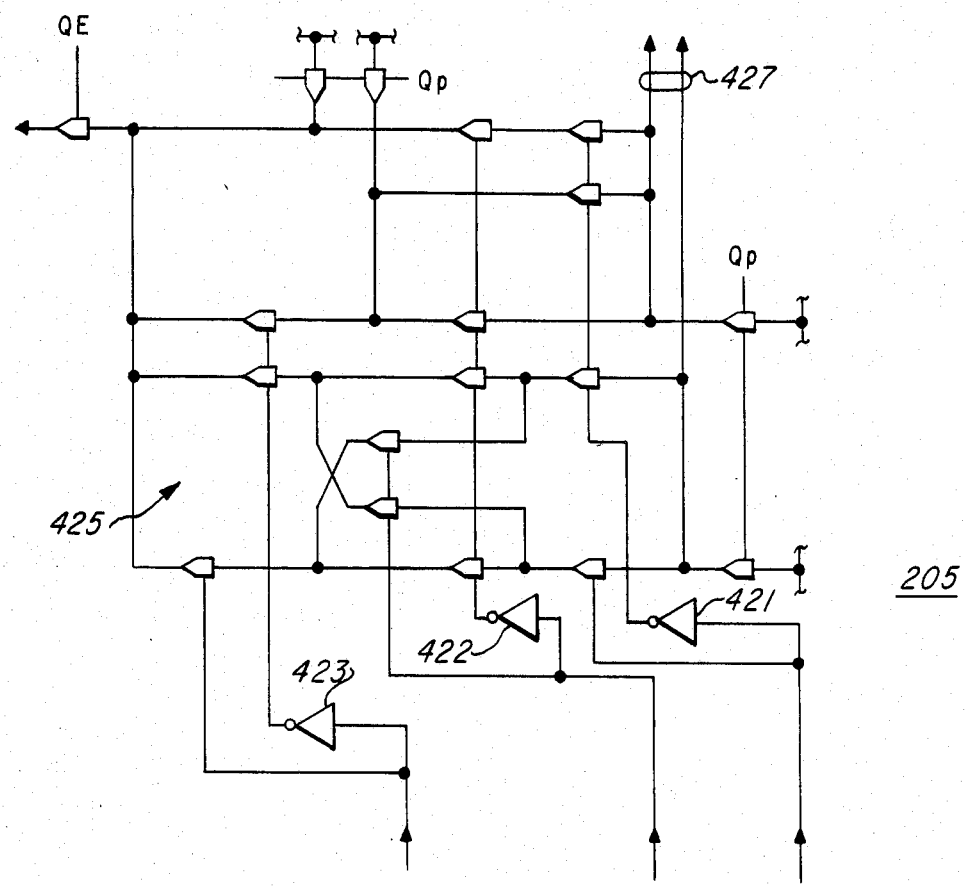
FIG. 9 is a schematic diagram of a carry-save-adder circuit used in FIG. 5.

FIG. 9 is a schematic diagram of a carry-save adder circuit 205 as well as CSA delay 183, being that the circuits are identical. There are three inputs supplied to the inverters 421, 422, and 423 for the summation of th circuit by the adder circuit that is provided through the implementation of the transistor logic 425, the output of which is provided on data bus 427. This is a full adder circuit and provides the sum output as well as a carry output via data bus 427.

Figure 10:
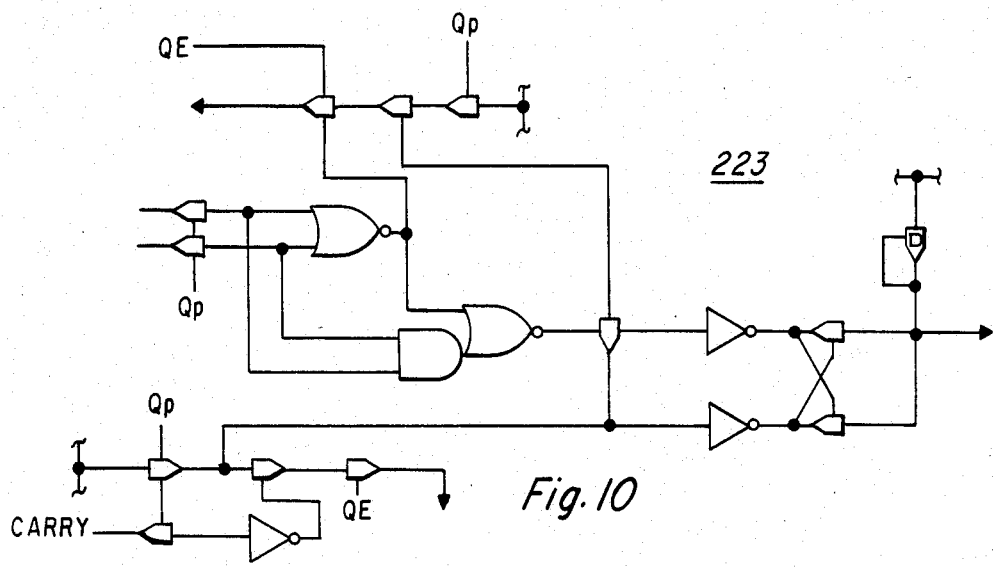
FIG. 10 is a schematic diagram of a carry-ripple-adder used in FIG. 5.
Figure 11:
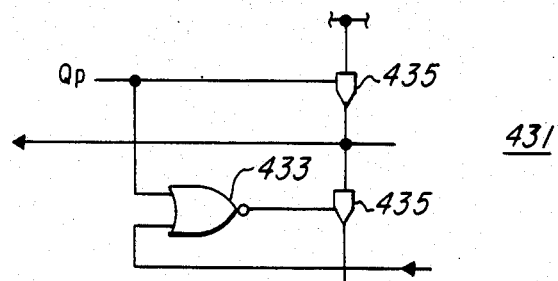
FIG. 11 is a schematic diagram of a carry circuit used in the embodiment of FIG. 5.

FIG. 10, which is similar to the circuit of FIG. 9, is the carry-ripple adder and represents each stage of the device 223 in which the intermediate register 219 outputs are summed by the carry ripple adder 223. As shown in the FIG. 5 separating each group of 5 carry-ripple adders is a carry circuit 431 which is illustrated in FIG. 11 and includes an NOR gate 433 and two MOS transistors 435. FIG. 10B is the circuit which provides the carry input for the carry-ripple adder.

Figure 12A:
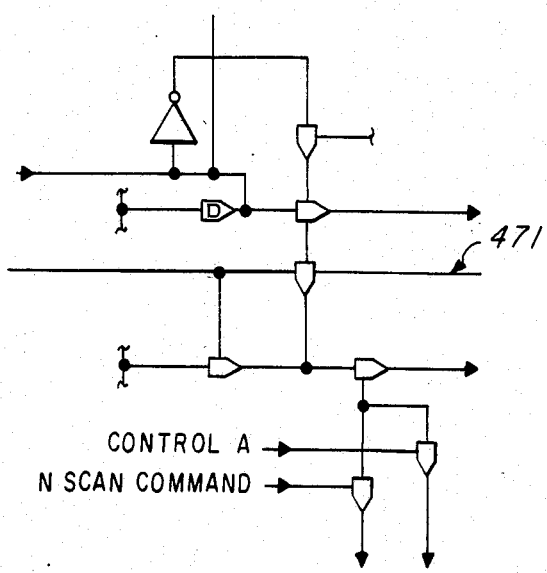
FIGS. 12A and 12B are schematic diagrams of the intermediate registers in the output stages of FIG. 5.
Figure 12B:
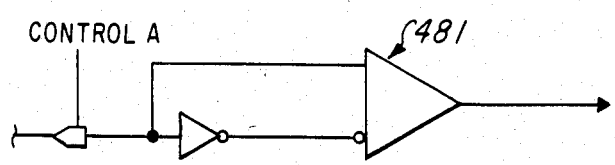

FIGS. 12A and 12B are the intermediate registers in the output buffer stages and also demonstrate the fact that the microprocessor controls the loading and storage of data within the transistors located at 471.

Figure 13:
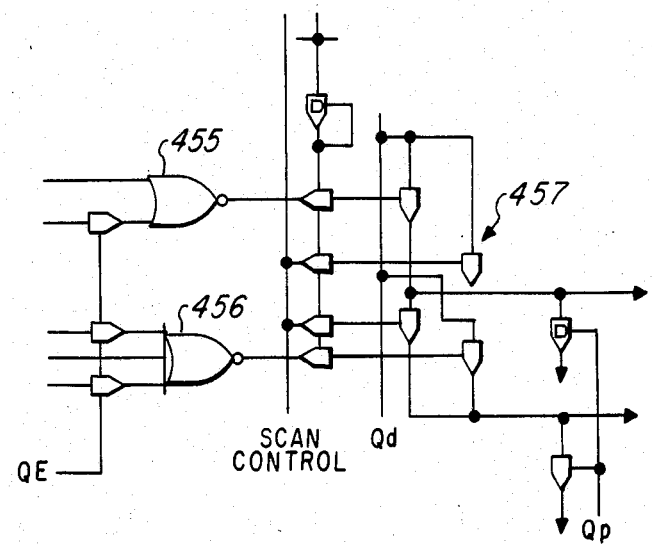
FIG. 13 is a schematic diagram of the store control circuit of FIG. 5.

FIG. 13 is a store control circuit of FIG. 5 and includes the NOR gate 455, 456 and the transistors 457.

Figure 14:
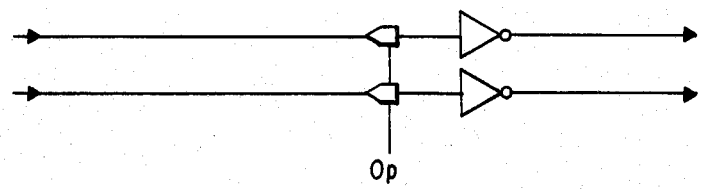
FIG. 14 is the buffer control of FIG. 5.

FIG. 14 provides a schematic diagram of the circuit which is used to delay the output of the two least-significant intermediate register bits (which do not need to be accumulated) into the product register.

Figure 15:
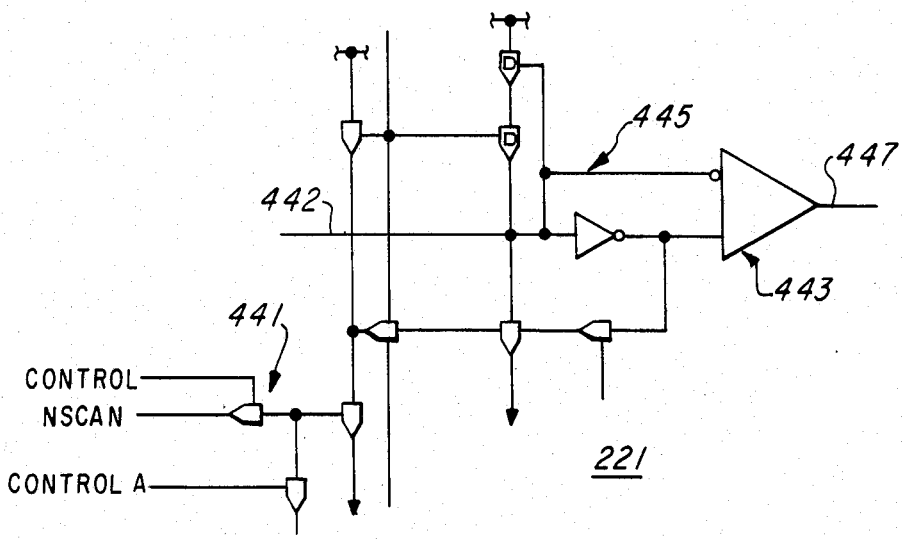
FIG. 15 is a schematic diagram of the intermediate registers 21 of the FIG. 5.

FIG. 15 is the block schematic diagram of the product register 229. The store control circuit is illustrated in FIG. 13 and is used in conjunction with the scan control that is provided by the computer as well as the precharge pulse and the evaluation pulse and includes gated OR functions that are implemented by OR gates 444, 445 and 446, and the transistor circuits generally at 457.

Although the present invention has been described in relation to a specific preferred embodiment, it will be clearly understood by those skilled in the art that other optional features may be included within the multiplier or substituted for features described without departing from the scope of the invention.

What is claimed is:

1. A digital multiplication circuit comprising:
   a Booth recoder means for recoding a multiplier into N Booth operation sets where N is a positive integer that equals one half the number of bits in the multiplier;
   a plurality of N partial product selector means having inputs and outputs connected in cascade arrangement from output to input with the Nth output being an intermediate output of the digital multiplication circuit, the cascade arrangement being N multiplicand sets of M bits in length and each member of the plurality of N partial product selector means being connected to a member of the N operation sets for implementing the recoded Booth operation set on a multiplicand set and where M is a positive integer;

summation means for summing the contents of the plurality of N partial product selector means the summation means including a second plurality of summing means with predetermined members of the second plurality of summing means being located between predetermined members of the plurality of N partial product selector means; and a domino means, operatively connected to the plurality of partial product selector means, for generating a plurality of evaluation pulses with each single evaluation pulse of the plurality of evaluation pulses being generated to represented a worse case signal propagation time delay through a predetermined partial product selector means and connected to evaluate the predetermined member of the plurality of partial product selector means to provide outputs therefrom of each single partial product selector means when evaluated.

2. The digital multiplication circuit to claim 1 wherein the domino means comprises:
a clock means for providing a precharge signal;
a plurality of dummy load means wherein each dummy load means includes;
a partial product stage means for converting the precharge signal to an evaluation pulse.

3. The digital multiplication circuit according to claim 2 wherein the summation means comprises:
a plurality of summation circuits connected to a preselected dummy load means for providing an evaluation pulse to each member of plurality of N partial product selector means at the completion of the booth operation set that is connected to the corresponding partial product selector means.

4. The digital multiplication circuit according to claim 1 wherein the second plurality of summing means comprises;
a plurality of full adder circuit means for combining a first input, a second input, and a third input.

5. The digital multiplication circuit according to claim 1 wherein each single summing means of the second plurality of summing means comprises:
a full adder circuit means having a first input, a second input, and a third input.

6. The digital multiplication circuit according to claim 1 wherein the second plurality of summing means comprises:
a first plurality of full adder circuits connected to sum the output of a first multiplicand set from a preselected partial product selector means, a second multiplicand set from a second preselected partial product selector means and a third multiplicand set from a third preselected partial product selector means.

7. The digital multiplication circuit according to claim 6 wherein the second plurality of summing means further comprises:
a second set of full adder circuit means for combining the output of the first set of full adder means with the output of a fourth multiplicand set from a fourth preselected partial product selector means.

8. The digital multiplication circuit according to claim 7 wherein the second plurality of summing means further comprises:
a third set of full adder circuit means connected to combine the output of the second set of full adders means with a fifth multiplicand set from a fifth preselected partial product selector means.

9. The digital multiplication circuit according to claim 8 wherein the second plurality of summing means further comprises:
a fourth set of full adder means for combining the output of the third set of full adder means with a sixth multiplicand set from a sixth preselected partial product selector means.

10. The digital multiplication circuit according to claim 1 further comprising:
an intermediate set of registers for storing the intermediate output.

11. The digital multiplication circuit according to claim 10 further comprising:
a second summation circuit means for selectively combining the outputs of the intermediate set of registers to obtain a product of the multiplicand and the multiplier.

12. The digital multiplication circuit according to claim 11 further comprising:
a plurality of storage register means for storing the product of the multiplier and the multiplicand.

13. A method of performing digital multiplication comprising:
decoding a multiplier into N Booth operation sets where N is a positive integer that equals one half the number of bits in the multiplier;
implementing a decoded Booth operation set on a multiplicand sets of M bits in length with a plurality of N partial product selector means having inputs and outputs connected in cascade arrangement from output to input with the nth output being an intermediate output of the the multiplication and each member of the plurality of N partial product selector means being connected to receive a member of the N Booth operation sets;
summing the contents of the plurality of N partial product selector means with a summation means including a second plurality of summing means with predetermined members of the second plurality of summing means being located between predetermined members of the plurality of N partial product registers; and
generating a plurality of evaluation pulses with each single evaluation pulse being generated to represent a worse case single propagation time delay through a predetermined partial product selector means of the plurality of partial product selector means and connected to evaluate the predetermined member of the plurality of partial product selector means to provide an output thereby.

14. The method according to claim 13 wherein the step of generating each single evaluation pulse of the plurality of evaluation pulses comprises:
providing a precharge signal; and
converting the precharge signal to an evaluation pulse.

* * * * *